(12) United States Patent
Cheng et al.

(10) Patent No.: US 11,923,285 B2
(45) Date of Patent: Mar. 5, 2024

(54) ELECTRONIC DEVICE PACKAGE AND METHOD OF MANUFACTURING THE SAME

(71) Applicant: Advanced Semiconductor Engineering, Inc., Kaohsiung (TW)

(72) Inventors: Po-Jen Cheng, Kaohsiung (TW); Chien-Fan Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 198 days.

(21) Appl. No.: 17/142,198

(22) Filed: Jan. 5, 2021

(65) Prior Publication Data
US 2022/0216136 A1    Jul. 7, 2022

(51) Int. Cl.
| | |
|---|---|
| H01L 23/495 | (2006.01) |
| H01L 21/48 | (2006.01) |
| H01L 21/56 | (2006.01) |
| H01L 23/00 | (2006.01) |
| H01L 23/31 | (2006.01) |
| H01L 23/498 | (2006.01) |
| H01L 23/538 | (2006.01) |
| H01L 25/18 | (2023.01) |

(52) U.S. Cl.
CPC .... *H01L 23/49838* (2013.01); *H01L 21/4853* (2013.01); *H01L 21/4857* (2013.01); *H01L 21/568* (2013.01); *H01L 23/3128* (2013.01); *H01L 23/3142* (2013.01); *H01L 23/49816* (2013.01); *H01L 23/49822* (2013.01); *H01L 23/5385* (2013.01); *H01L 23/5389* (2013.01); *H01L 24/16* (2013.01); *H01L 25/18* (2013.01); *H01L 23/3135* (2013.01); *H01L 2224/16227* (2013.01)

(58) Field of Classification Search
CPC ............. H01L 23/5385; H01L 23/5389; H01L 23/49822; H01L 25/0657
USPC .................................................. 257/773, 786
See application file for complete search history.

(56) References Cited

U.S. PATENT DOCUMENTS

| | | | |
|---|---|---|---|
| 6,825,541 B2* | 11/2004 | Huang | H01L 24/05 257/676 |
| 9,735,131 B2* | 8/2017 | Su | H01L 25/50 |
| 10,276,541 B2* | 4/2019 | Chen | H01L 25/0657 |
| 2011/0024899 A1* | 2/2011 | Masumoto | H01L 23/49816 257/E21.705 |
| 2012/0061814 A1* | 3/2012 | Camacho | H01L 25/105 257/676 |
| 2016/0035709 A1* | 2/2016 | Chen | H01L 23/3142 269/302 |
| 2016/0118333 A1* | 4/2016 | Lin | H01L 22/20 257/773 |

(Continued)

*Primary Examiner* — Nitin Parekh
(74) *Attorney, Agent, or Firm* — FOLEY & LARDNER LLP

(57) ABSTRACT

An electronic device package and a method for manufacturing the same are provided. The electronic device package includes a circuit layer and an electronic component. The circuit layer includes a dielectric layer having an opening, and an electrical contact. A width of an aperture of the opening increases from a first surface toward a second surface. The electrical contact is at least partially disposed in the opening and exposed through the opening. The electronic component is disposed on the second surface and electrically connected to the circuit layer.

10 Claims, 20 Drawing Sheets

(56) References Cited

U.S. PATENT DOCUMENTS

| | | | |
|---|---|---|---|
| 2016/0163564 A1* | 6/2016 | Yu | H01L 21/56 |
| | | | 438/126 |
| 2016/0163663 A1* | 6/2016 | Kim | H01L 27/156 |
| | | | 257/737 |
| 2017/0084589 A1* | 3/2017 | Kuo | H01L 23/3128 |
| 2018/0108638 A1* | 4/2018 | Lin | H01L 25/0657 |
| 2019/0131241 A1* | 5/2019 | Jeng | H01L 25/105 |
| 2019/0206783 A1* | 7/2019 | Kim | H01L 23/49827 |
| 2019/0378727 A1 | 12/2019 | Matsuura et al. | |

* cited by examiner

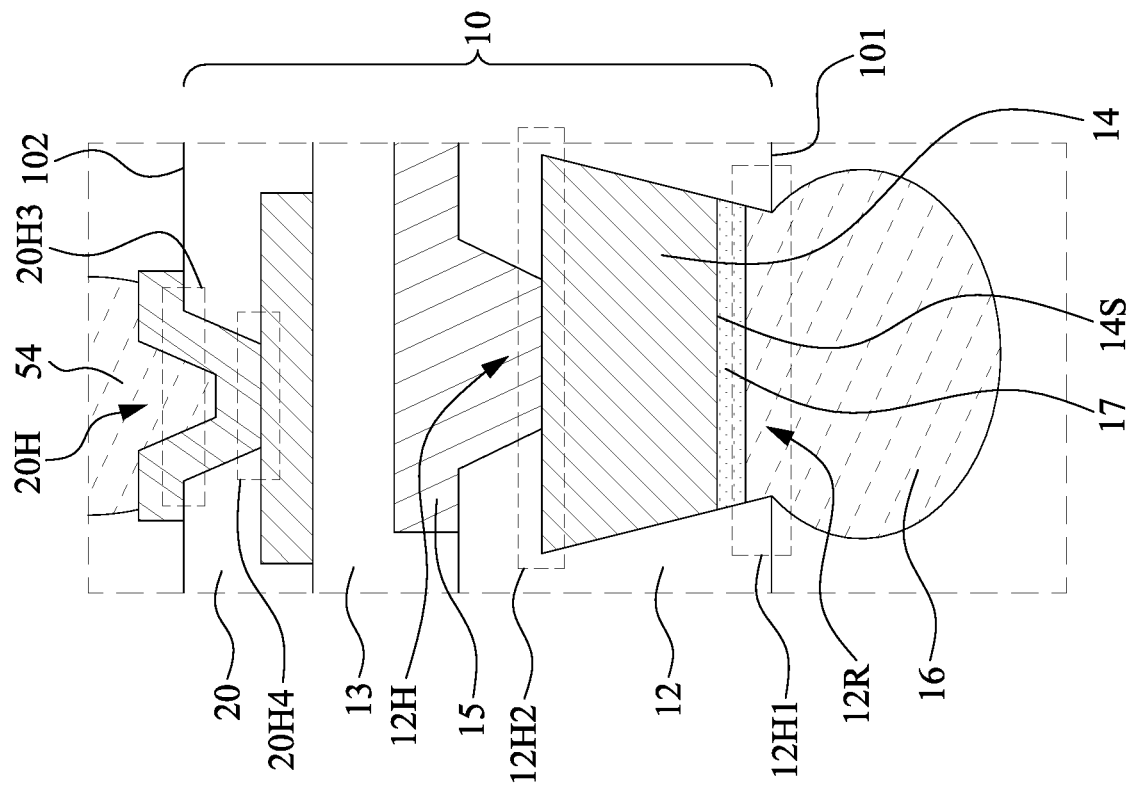

ELECTRONIC DEVICE PACKAGE AND METHOD OF MANUFACTURING THE SAME

TECHNICAL FIELD

The present disclosure generally relates to an electronic device package and method of manufacturing the same.

BACKGROUND

In a conventional electronic device package, a substrate with embedded circuit is used to dispose an electronic component on one side, and to electrically connect a circuit board on the other side. The substrate, however, cannot be applied in advanced electronic device due to its line width/spacing (L/S) limits. Also, the overall thickness of the conventional electronic device package cannot be reduced. A redistribution layer (RDL) having narrower L/S has been proposed to replace the substrate. The RDL needs to be formed on a glass wafer, and flipped over to mount solder balls. Accordingly, the conventional process for manufacturing the RDL suffers from the following problems. The glass wafer is difficult to be released from the RDL. The thickness of the bottommost wiring layer is not sufficiently thick. Thus intermetallic compound (IMC) may be generated during successive thermal process, causing reliability to deteriorate. In addition, an additional under bump metallurgy (UBM) is required due to the insufficient thickness of the bottommost wiring layer, which increases fabrication costs.

SUMMARY

In some arrangements, an electronic device package includes a first circuit layer and a first electronic component. The first circuit layer includes a first surface, and a second surface opposite to the first surface. The first circuit layer includes a first dielectric layer having a first opening, and a first electrical contact. A width of an aperture of the first opening increases from the first surface toward the second surface. The first electrical contact is at least partially disposed in the first opening and exposed through the first opening. The first electronic component is disposed on the second surface and electrically connected to the first circuit layer.

In some arrangements, an electronic device package includes an RDL, a solder conductor, a UBM, and a semiconductor die. The RDL includes a first surface, and a second surface opposite to the first surface. The RDL includes a dielectric layer having an opening, and a contact pad. The contact pad is at least partially disposed in the opening and exposed through the opening. A width of an aperture of the opening increases from the first surface toward the second surface. The UBM is disposed on the second surface of the RDL and electrically connected to the RDL. The solder conductor is disposed on the contact pad. The semiconductor die is disposed on the second surface of the RDL.

In some arrangements, a method of manufacturing an electronic device package includes providing a panel-level substrate having a conductive layer. A pad is formed on the conductive layer. A circuit layer is formed on the pad. An electronic component is formed on the circuit layer. The panel-level substrate is released from the conductive layer. At least a portion of the conductive layer is removed to form an electrical contact.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 1A is an enlarged schematic view of a region A in FIG. 1 in accordance with some arrangements of the present disclosure.

FIG. 2A-1 is a schematic view of a region C in FIG. 2A in accordance with some arrangements of the present disclosure.

DETAILED DESCRIPTION

Figure 1:
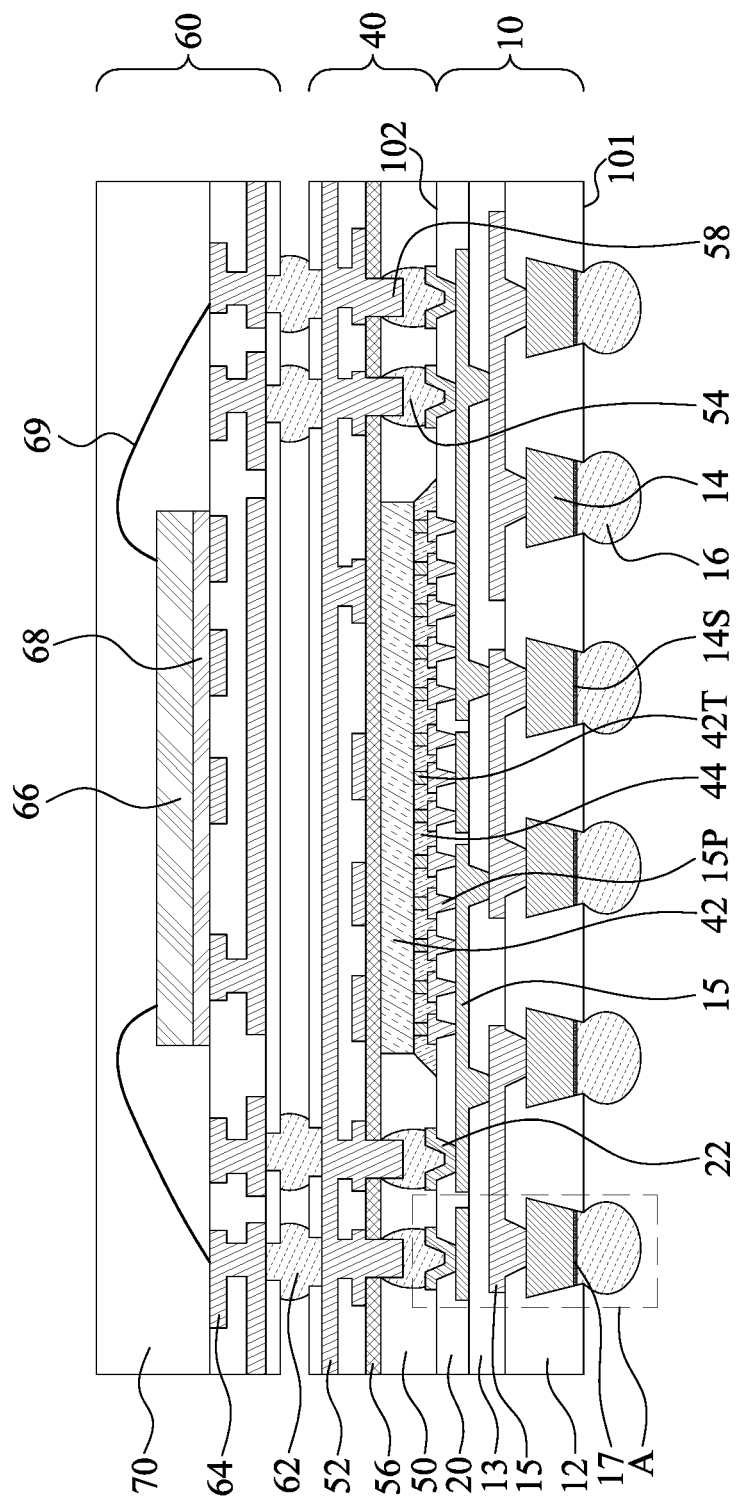
FIG. 1 is a schematic cross-sectional view of an electronic device package structure in accordance with some arrangements of the present disclosure.

The following disclosure provides for many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various arrangements and/or configurations discussed.

Some arrangements, or examples, illustrated in the figures are disclosed below using specific language. It will nevertheless be understood that the arrangements and examples are not intended to be limiting. Any alterations and modifications of some of the disclosed arrangements, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various arrangements and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

FIG. 1 is a schematic cross-sectional view of an electronic device package structure 1 in accordance with some arrangements of the present disclosure. FIG. 1A is an enlarged schematic view of region A in FIG. 1, in accordance with some arrangements of the present disclosure. As shown in FIG. 1 and FIG. 1A, the electronic device package 1 includes a circuit layer (also referred to as a first circuit layer) 10 and an electronic component (also referred to as a first electronic component) 40. The circuit layer 10 includes a first surface 101, and a second surface 102 opposite to the first surface 101. In some arrangements, the first surface 101 may be configured as a ball side of the circuit layer 10, and adapted to receive solder balls for connecting an external electronic component such as a printed circuit board (PCB). The second surface 102 may be configured as a component side of the circuit layer 10, and adapted to dispose an internal electronic component such as molded structure, semiconductor die or the like. In some arrangements, the circuit layer 10 may include, but is not limited to, a bumping-level circuit layer such as a RDL. By way of example, the line width/spacing (L/S) of the circuit layer 10 may be lower than about 10 µm/about 10 µm such as between about 2 µm/about 2 µm and about 5 µm/about 5 µm or even lower than about 2 µm/about 2 L/S is defined as a minimum value of a line width and a line spacing of a circuit layer. The bumping-level circuit layer may be patterned and defined by a suitable etching technique, e.g., photolithography-plating-etching technique. The circuit layer 10 may include a plurality of dielectric layers such as a first dielectric layer 12, a second dielectric layer 20, and one or more intermediate dielectric layers 13. The intermediate dielectric layers 13 are between the first dielectric layer 12 and the second dielectric layer 20. The material of the dielectric layers may include organic insulative material such as epoxy resin, bismaleimide-triazine (BT) resin, inorganic insulative material such as silicon oxide, silicon nitride, or a combination thereof.

The circuit layer 10 also includes a plurality of wiring layers 15 stacked alternately with respect to the dielectric layers. By way of example, a dielectric layer may be interposed between two wiring layers 15. The material of the wiring layers 15 may include metal such as copper, or an alloy thereof. The first dielectric layer 12 may have the first surface 101. That is, the first dielectric layer 12 may be the bottommost dielectric layer, and the first surface 101 of the circuit layer 10 may be the surface of the first dielectric layer 12. The first dielectric layer 12 may include a first opening 12H. The aperture of the first opening 12H increases from the first surface 101 toward the second surface 102. That is, the width of the aperture of the first opening 12H increases as the aperture extends in a direction from the first surface 101 toward the second surface 102. In some arrangements, the first opening 12H has a first aperture 12H1 (shown inside of dashed boxes) proximal to the first surface 101, and a second aperture 12H2 (shown inside of dashed boxes) away from the first surface 101. The second aperture 12H2 has a width larger than a width the first aperture 12H1. As shown in FIG. 1A, the widths of the first aperture 12H1 and the second aperture 12H2 are parallel, and are perpendicular to a line that traverses the first surface 101 and the second surface 102. By way of example, the sidewall of the first opening 12H may be substantially straight, and the first opening 12H of the first dielectric layer 12 may include an inverted trapezoid cross-sectional shape as shown in FIG. 1A.

The circuit layer 10 may include a first electrical contact 14 at least partially disposed in the first opening 12H and exposed through the first opening 12H. In some arrangements, the first electrical contact 14 may be, but is not limited to be, a portion of a bottommost wiring layer 15 of the circuit layer 10.

In some arrangements, the first electrical contact 14 may be configured as a pad or a contact pad. In some arrangements, the electronic device package 1 may further include a solder conductor (also referred to as a first solder conductor) 16 disposed on and electrically connected to the contact pad. The first solder conductor 16 is partially disposed in the first opening 12H. The first solder conductor 16 may include a solder ball, solder bump or the like. The solder material of the first solder conductor 16 may, but is not limited to, include tin (Sn), lead (Pb), gold (Au), copper (Cu) or an alloy thereof. The first solder conductor 16 is electrically connected to the first electrical contact 14. In some arrangements, the first solder conductor 16 may be in contact with the first electrical contact 14, and configured to electrically connect the first electrical contact 14 to an external electronic component such as a circuit board 80 (shown in FIG. 3I). The circuit board 80 is disposed under the first surface 101. The circuit board 80 is electrically connected to the first electrical contact 14 through the first solder conductor 16. In some arrangements, a surface 14S of the first electrical contact 14 is recessed from the first surface 101 of the first dielectric layer 12, thus forming a recess 12R. A portion of the first solder conductor 16 may be filled in the recess 12R, and a bonding strength between the first electrical contact 14 and the first solder conductor 16 can be enhanced.

In some arrangements, an IMC 17 may exist between the first electrical contact 14 and the first solder conductor 16. The IMC 17 may be electrically connected to the first electrical contact 14 and the first solder conductor 16. The IMC 17 may be in contact with the first electrical contact 14 and the first solder conductor 16. The thickness of electrical contact 14 is thick. In some arrangements, a thickness of the first electrical contact 14 is larger than a thickness of a wiring layer 15 of the circuit layer 10. By way of example, the thickness of the contact pad may be larger than 10 micrometers. The thicker thickness helps to ensure the conductivity of the first electrical contact 14 even if the IMC 17 generates compounds such as Sn—Cu compound. Also, with the thicker first electrical contact 14, a UBM can be omitted to reduce fabrication cost.

As shown in FIG. 1, the first electronic component 40 is disposed on the second surface 102 and electrically connected to the circuit layer 10. In some arrangements, the first electronic component 40 may include a molded electronic component such as a molded application module. By way of example, the first electronic component 40 includes at least one first semiconductor die 42 and an encapsulation layer (also referred to as a first encapsulation layer) 50. The at least one first semiconductor die 42 is disposed on the second surface 102 of the circuit layer 10 and electrically connected to the circuit layer 10. The at least one first semiconductor die 42 may include an active semiconductor die such as an application specific integrated circuit (ASIC). The at least one first semiconductor die 42 may be electrically connected to the circuit layer 10 in a flip chip manner with an active surface facing the second surface 102 of the circuit layer 10. In some arrangements, the first semiconductor die 42 may include a plurality of electrical terminals 42T such as conductive studs bonded to bonding pads 15P of the circuit layer 10. The bonding pads 15P may be a portion of an uppermost wiring layer 15 of the circuit layer 10. The first encapsulation layer 50 is disposed on the second surface 102 of the circuit layer 10 and encapsulating the at least one first semiconductor die 42. The first encapsulation layer 50 may include molding compound such as epoxy-based material (e.g. FR4), resin-based material (e.g. Bismaleimide-Triazine (BT), Polypropylene (PP)), or other suitable materials. In some arrangements, the first electronic component 40 may further include an underfill 44 disposed between the at least one semiconductor die 42 and the second surface 102 of the circuit layer 10, and surrounding the electrical terminals 42T and the bonding pads 15P. The material of the underfill 44 is different from the first encapsulation layer 50. In some alternative arrangements, the underfill 44 can be omitted, and the first encapsulation layer 50 can further be disposed between the at least one semiconductor die 42 and the second surface 102 of the circuit layer 10.

As shown in FIG. 1A, the second dielectric layer 20 includes a second opening 20H. The aperture of the second opening 20H increases from the first surface 101 toward the second surface 102. That is, the width of the aperture of the second opening 20H increases as the aperture extends in a direction from the first surface 101 toward the second surface 102. In some arrangements, the second opening 20H has a third aperture 20H3 (shown inside of dashed box) proximal to the second surface 102, and a fourth aperture 20H4 (shown inside of dashed box) away from the second surface 102. The fourth aperture 20H4 has a width smaller than a width the third aperture 20H3. As shown in FIG. 1A, the widths of the third aperture 20H3 and the fourth aperture 20H4 are parallel, and are perpendicular to a line that traverses the first surface 101 and the second surface 102. By way of example, the sidewall of the second opening 20H may be substantially straight, and the second opening 20H may include an inverted trapezoid cross-sectional shape. Alternatively, the sidewall of the second opening 20H may include a curved sidewall. The circuit layer 10 may further include a second electrical contact 22 at least partially disposed in the second opening 20H2 and exposed through the second opening 20H2. In some arrangements, the second electrical contact 22 may be, but is not limited to be, a portion of an uppermost wiring layer 15 of the circuit layer 10. In some arrangements, the second electrical contact 22 may be partially disposed on the second surface 102, and partially inserted into the second opening 20H. In some arrangements, the second electrical contact 22 may include a contact pad, or may include a UBM.

The first electronic component 40 may further include another circuit layer (also referred to as a second circuit layer) 52 and another solder conductor (also referred to as a second solder conductor) 54. The circuit layer 52 is disposed on the first encapsulation layer 50. In some arrangements, the circuit layer 52 may include, but is not limited to, a substrate-level circuit layer such as a package substrate. The L/S of substrate-level circuit layer may be larger than that of a bumping-level circuit layer. In some arrangements, the circuit layer 52 may include a bumping-level circuit layer such as an RDL. The second solder conductor 54 is disposed on the second electrical contact 22 and encapsulated by the first encapsulation layer 50, and electrically connecting the circuit layer 10 to the circuit layer 52. The second solder conductor 54 may include a solder ball, solder bump or the like. The solder material of the second solder conductor 54 may, but is not limited to, include tin (Sn), lead (Pb), gold (Au), copper (Cu) or an alloy thereof. The UBM of the second electrical contact 22 can help to enhance the bonding strength between the second electrical contact 22 and the second solder conductor 54.

In some arrangements, the first electronic component 40 further includes an adhesion layer 56 and a conductive structure 58. The adhesion layer 56 may include a non-conductive film (NCF) or a non-conductive paste (NCP). The adhesion layer 56 is disposed between the first encapsulation layer 50 and the circuit layer 52. The conductive structure 58 penetrates through the adhesion layer 56 and electrically connecting the circuit layer 52 to the second solder conductor 54. The conductive structure 58 may be partially inserted into the second solder conductor 54, and thus can be firmly bonded to the second solder conductor 54. The second electrical contact 22 may be configured as a UBM to receive the solder conductor 54, and the circuit layer 52 may be electrically connected to the circuit layer 10 through the conductive structure 58, the solder conductor 54 and the second electrical contact 22.

As shown in FIG. 1, the electronic device package 1 may further include another electronic component (also referred to as a second electronic component) 60 and another solder conductor (also referred to as a third solder conductor) 62. The second electronic component 60 is disposed on the circuit layer 52. The third solder conductor 62 is disposed between the circuit layer 52 and the second electronic component 60, and electrically connecting the second electronic component 60 to the circuit layer 52. The solder material of the third solder conductor 62 may, but is not limited to, include tin (Sn), lead (Pb), gold (Au), copper (Cu) or an alloy thereof. The second electronic component 60 may include a molded electronic component such as a molded memory module. The second electronic component 60 includes another circuit layer (also referred to as a third circuit layer) 64, another semiconductor die (also referred to as a second semiconductor die) 66, and another encapsulation layer (also referred to as a second encapsulation layer) 70. In some arrangements, the circuit layer 64 may include, but is not limited to, a bumping-level circuit layer such as an RDL. The second semiconductor die 66 is disposed on and electrically connected to the circuit layer 64. In some arrangements, the second semiconductor die 66 may be attached to the circuit layer 64 with a die attaching film (DAF) 68, and electrically connected to the circuit layer 64 with bonding wires 69. In some alternative arrangements, the second semiconductor die 66 may be electrically connected to the circuit layer 64 in a flip chop manner. In some arrangements, the second semiconductor die 66 may include a memory die. The second encapsulation layer 70 is disposed on the circuit layer 64 and encapsulates the second semiconductor die 66.

Figure 1B:
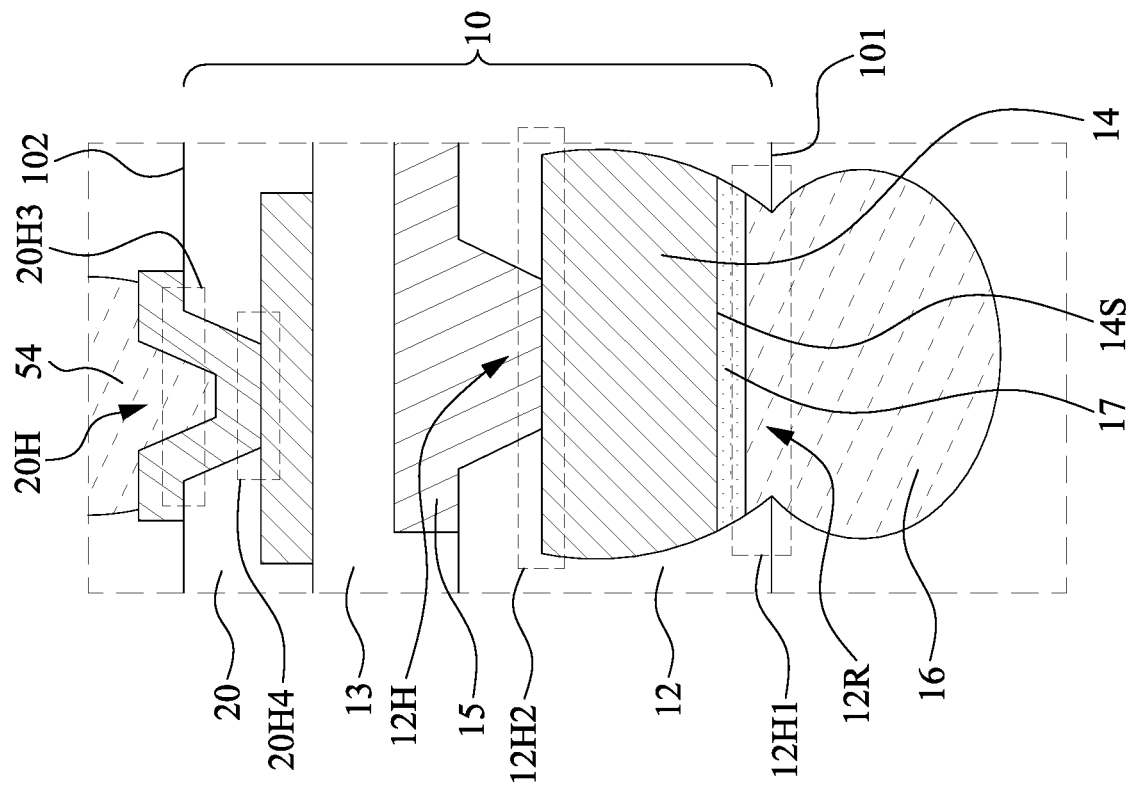
FIG. 1B is schematic view of an electronic device package structure in accordance with some other arrangements of the present disclosure.

FIG. 1B is schematic view of an electronic device package structure in accordance with some other arrangements of the present disclosure. As shown in FIG. 1B, in contrast to FIG. 1A, the first opening 12H in FIG. 1B includes a curved sidewall. By way of example, the sidewall of the first opening 12H may be tapered away from the first opening 12H. In some arrangements, a portion of the first solder conductor 16 is disposed in the first opening 12H, and the portion of the first solder conductor 16 includes a curved sidewall engaged with a portion of the curved sidewall of the first opening 12H. In some arrangements, the IMC 17 includes a curved sidewall engaged with a portion of the curved sidewall of the first opening 12H.

The electronic device packages and manufacturing methods of the present disclosure are not limited to the above-described arrangements, and may be implemented according to other arrangements. To streamline the description and for the convenience of comparison between various arrangements of the present disclosure, similar components of the following arrangements are marked with same numerals, and may not be redundantly described.

Figure 2:
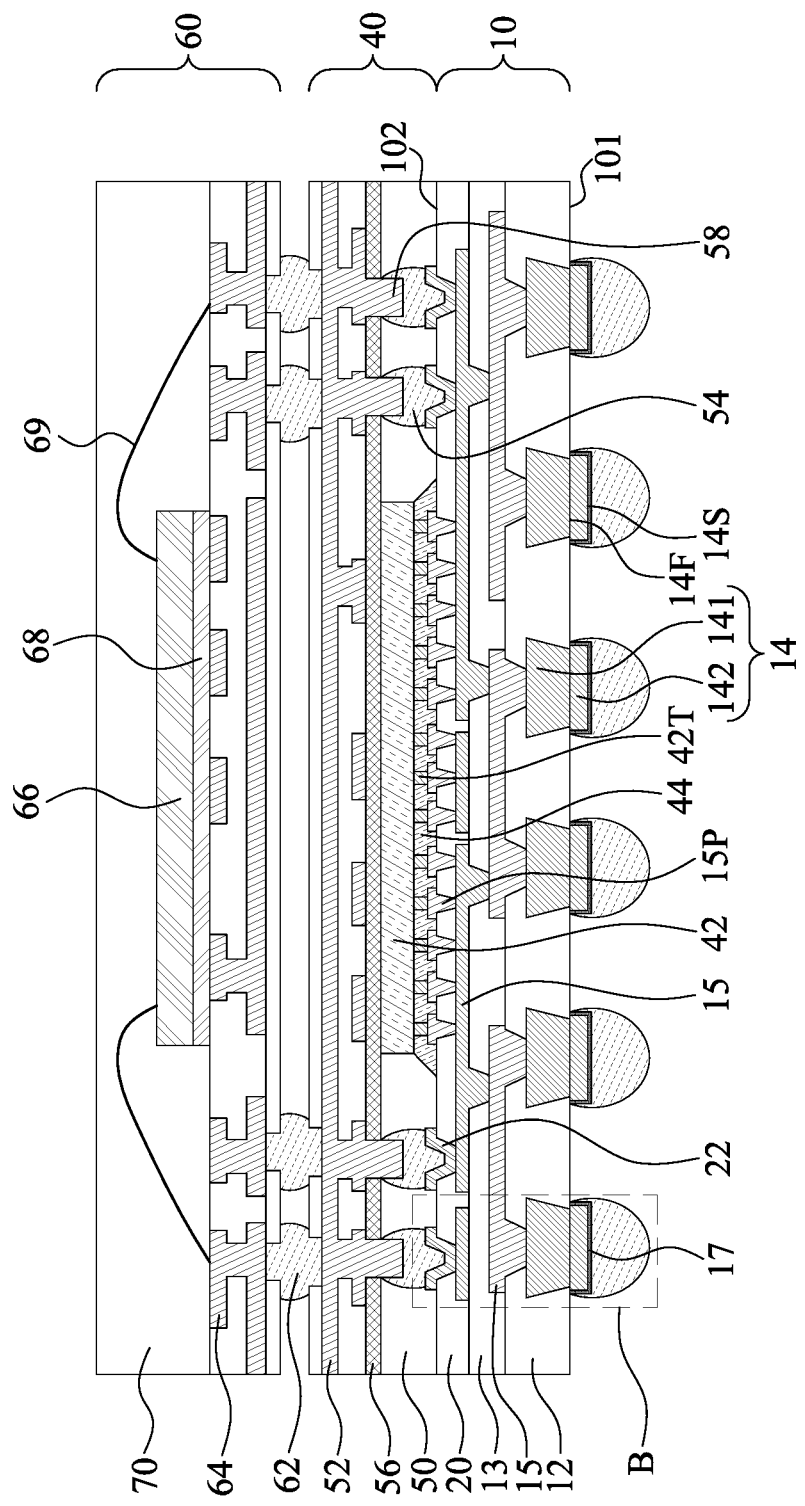
FIG. 2 is a schematic cross-sectional view of an electronic device package structure in accordance with some arrangements of the present disclosure.
Figure 2A:
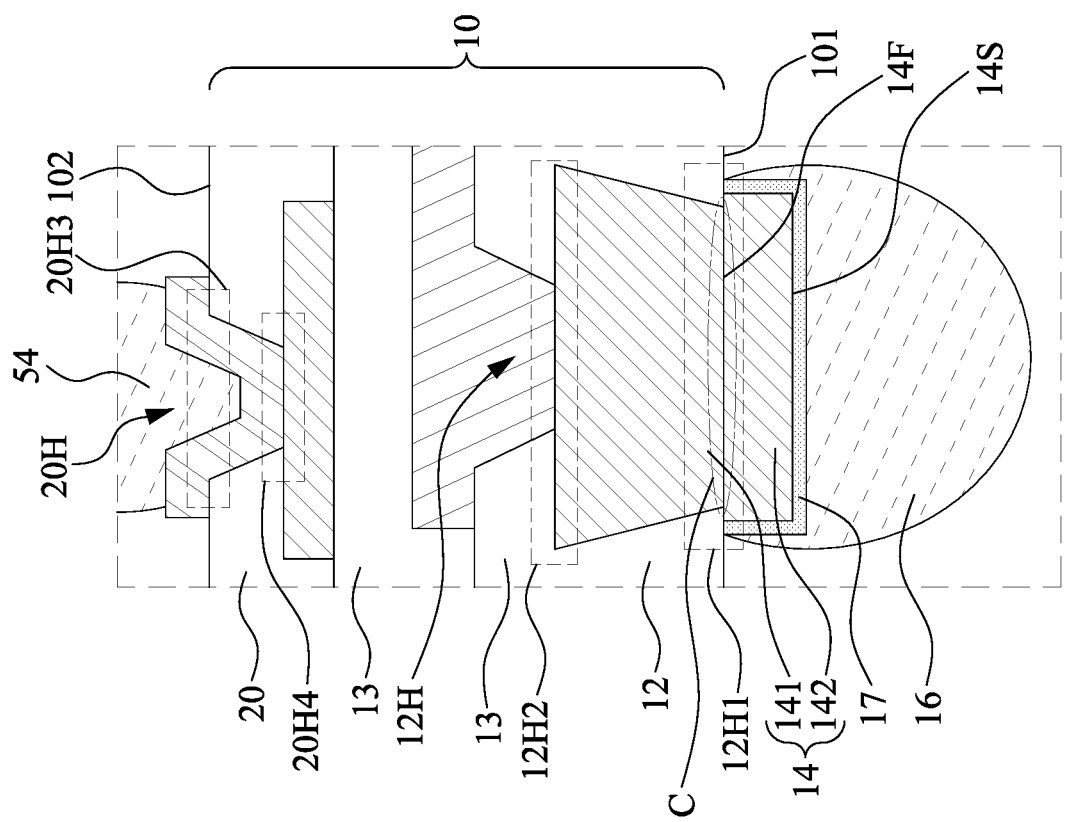
FIG. 2A is an enlarged schematic view of a region B in FIG. 2 in accordance with some arrangements of the present disclosure.
Figures 1, 2A:
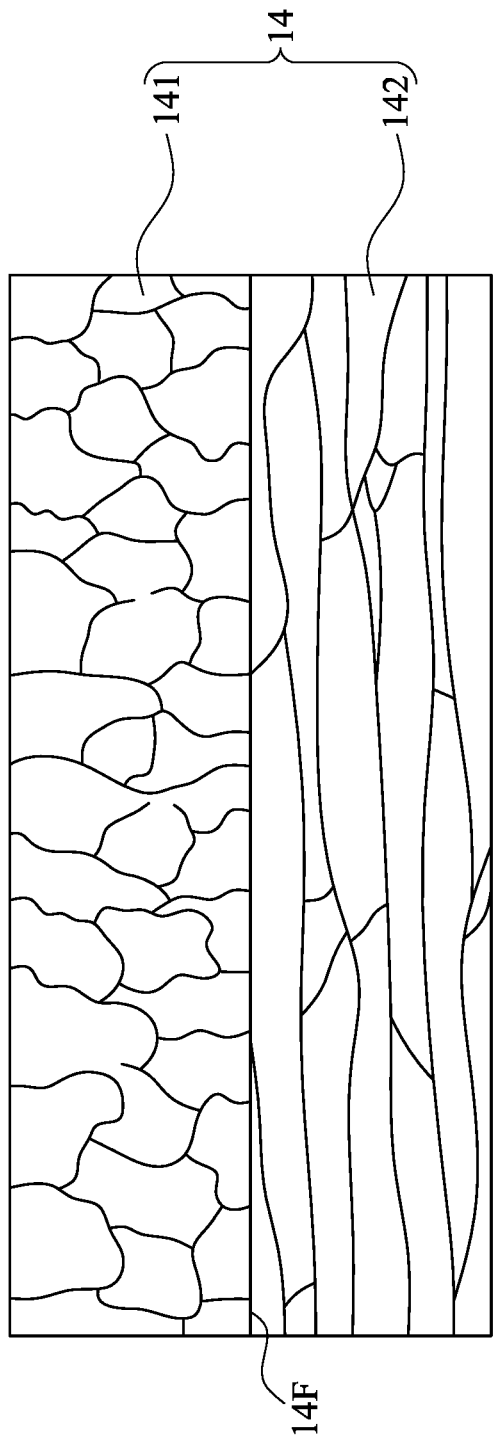

FIG. 2 is a schematic cross-sectional view of an electronic device package structure 2 in accordance with some arrangements of the present disclosure, and FIG. 2A is an enlarged schematic view of a region B in FIG. 2 in accordance with some arrangements of the present disclosure. As shown in FIG. 2 and FIG. 2A, in contrast to the electronic device package 1, the surface 14S of the first electrical contact 14 protrudes out from the first surface 101 of the first dielectric layer 12. In some arrangements, the first electrical contact 14 may include a first portion 141 disposed in the first opening 12H, and a second portion 142 interfacing the first portion 141 and partially covering the first surface 101 of the first dielectric layer 12. The first portion 141 and the second portion 142 may be collectively configured as a contact pad. The first portion 141 and the second portion 142 may include the same conductive material such as copper but having different metallographic structures and/or lattice orientations. By way of example, the first portion 141 may include electroplated Cu, and the second portion 142 may include rolled and annealed (RA) Cu as shown in FIG. 2A-1. An interface 14F may exist between the first portion 141 and the second portion 142. In some arrangements, the interface 14F of the first portion 141 and the second portion 142 may be substantially coplanar with the first surface 101 of the first dielectric layer 12. In some other arrangements, the first portion 141 and the second portion 142 do not have an interface therebetween. In some arrangements, an overall thickness of the first portion 141 and the second portion 142 is larger than a thickness of a wiring layer 15 of the circuit layer 10. By way of example, the thickness of the first portion 141 is larger than 10 micrometers, and the thickness of the second portion 142 is larger than 5 micrometers.

In some arrangements, the second portion 142 is wider than the first portion 141, and the first solder conductor 16 covers an upper surface and sidewalls of the second portion 142. In some arrangements, an IMC 17 may exist between the first solder conductor 16 and the upper surface and the sidewalls of the second portion 142. For example, the IMC 17 may include a U-shaped cross section as shown.

Compared with the first electrical contact 14 of FIG. 1, the overall thickness of the first portion 141 and the second portion 142 of the electronic device package 2 is thicker than the thickness of a wiring layer 15 of the circuit layer 10. Accordingly, the adverse influence of the IMC 17 can be alleviated, and the reliability can be increased, and a UBM can be omitted. The omission of the UBM can prevent from cold joint issue between the first solder conductor 16 and the UBM inside the first opening 12H. The second portion 142 can be wider than the first portion 141, and the wider second portion 142 can slow down formation of the IMC 17, and thus increase the conductivity and reliability of the first electrical contact 14. Moreover, the protruding second portion 142 is configured to receive the first solder conductor 16, and the protruding second portion 142 does not require a solder mask to define the first solder conductor 16. Accordingly, stress concentration in the interface between the solder mask and the first solder conductor 16 can be avoided, and thus the reliability of the first electrical contact 14 can be increased.

Figure 2B:
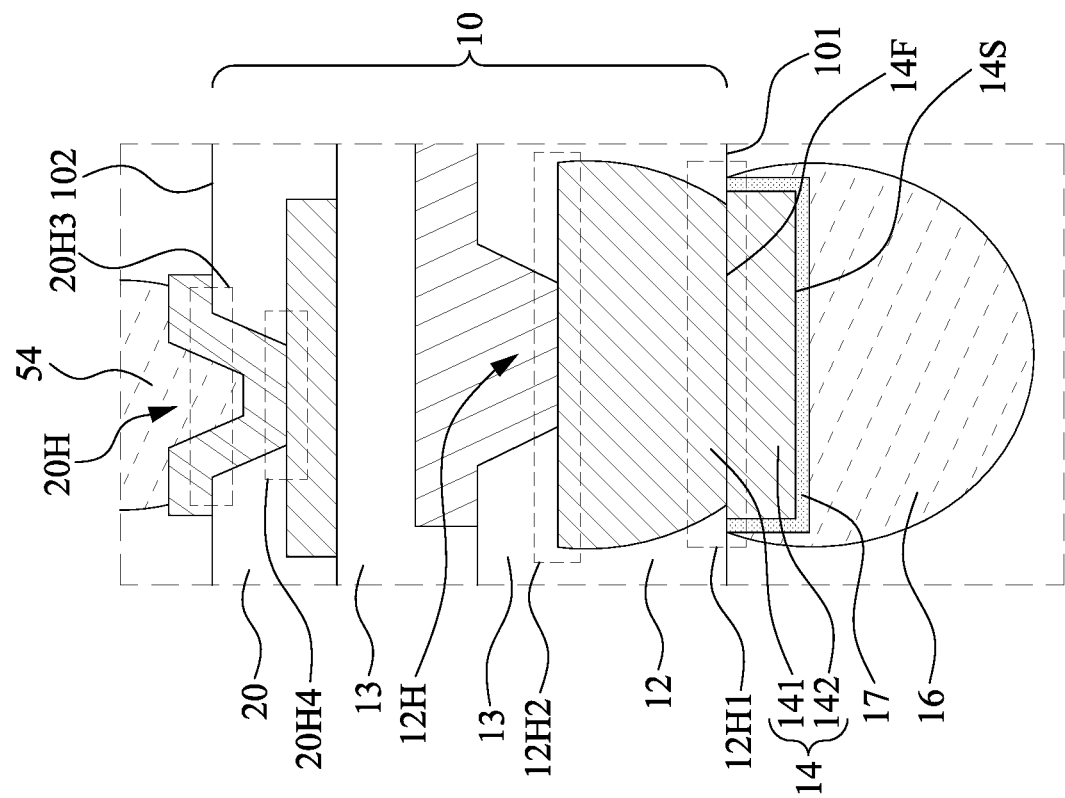
FIG. 2B is a schematic view of an electronic device package structure in accordance with some other arrangements of the present disclosure.
Figure 2C:
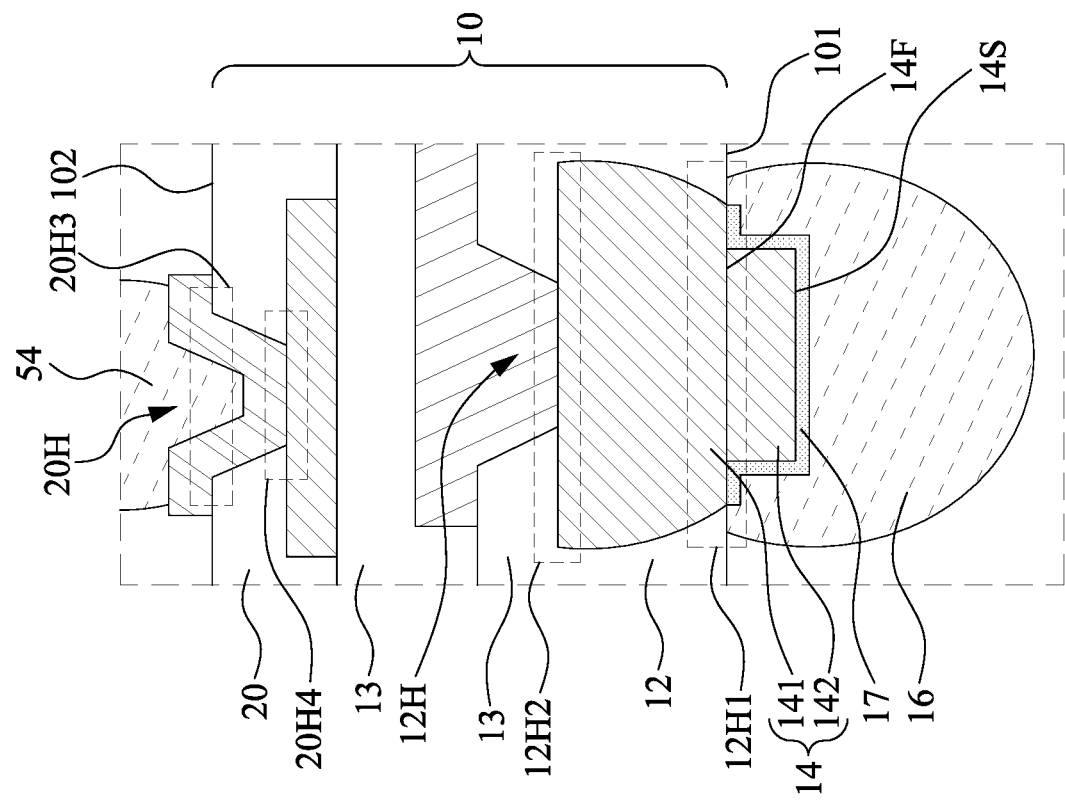
FIG. 2C is a schematic view of an electronic device package structure in accordance with some alternative arrangements of the present disclosure.

FIG. 2C is schematic view of an electronic device package structure in accordance with some alternative arrangements of the present disclosure. As shown in FIG. 2C, in contrast to FIG. 2B, the second portion 142 has a width that is narrower than a width of the first portion 141, and exposes a portion of an upper surface of the first portion 141. The first solder conductor 16 covers an upper surface and sidewalls of the second portion 142, and a portion of the upper surface of the first portion 141. The IMC 17 exists between the first solder conductor 16 and the upper surface and the sidewalls of the second portion 142, and between the first solder conductor 16 and the portion of the upper surface of the first portion 141. For example, the IMC 17 may include a hat shape cross section.

Figure 3A:
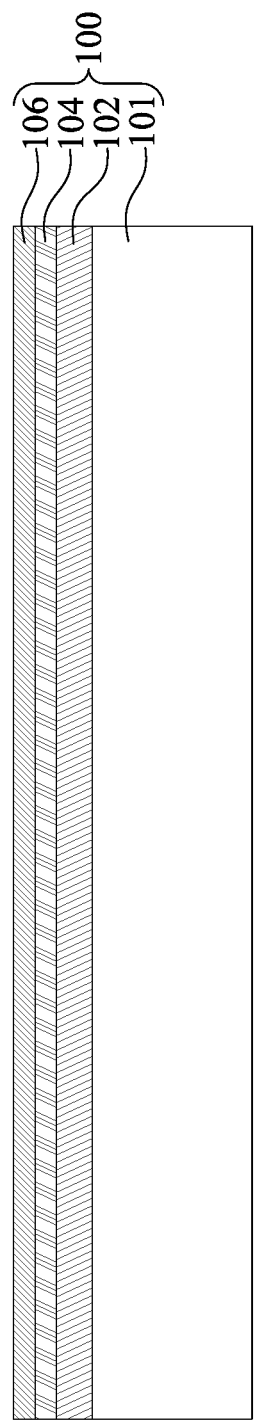
FIG. 3A, FIG. 3B, FIG. 3C, FIG. 3D, FIG. 3E, FIG. 3F, FIG. 3G, FIG. 3H and FIG. 3I illustrate operations of manufacturing an electronic device package in accordance with some arrangements of the present disclosure.

FIG. 3A, FIG. 3B, FIG. 3C, FIG. 3D, FIG. 3E, FIG. 3F, FIG. 3G, FIG. 3H and FIG. 3I illustrate operations of manufacturing an electronic device package in accordance with some arrangements of the present disclosure. As shown in FIG. 3A, a panel-level substrate 100 is provided. The panel-level substrate 100 includes a conductive layer 106 formed thereon. In some arrangements, the panel-level substrate 100 may be a copper foil substrate which includes a base material 101, a plurality of conductive layers 102 and 106, and a releasing film 104 between the conductive layers 102 and 106. The base material 101 may include an insulation material such as epoxy-based material (e.g. FR4). The conductive layers 102 and 106 may include copper foil layers. The copper foil substrate with the conductive layers 102 and 106 and the releasing film 104 formed thereon is a product available in the market. The panel-level substrate 100 is provided as a temporary supporter, and will be removed later. In some arrangements, the panel-level substrate 100 may be a rectangular panel-level substrate.

Figure 3B:
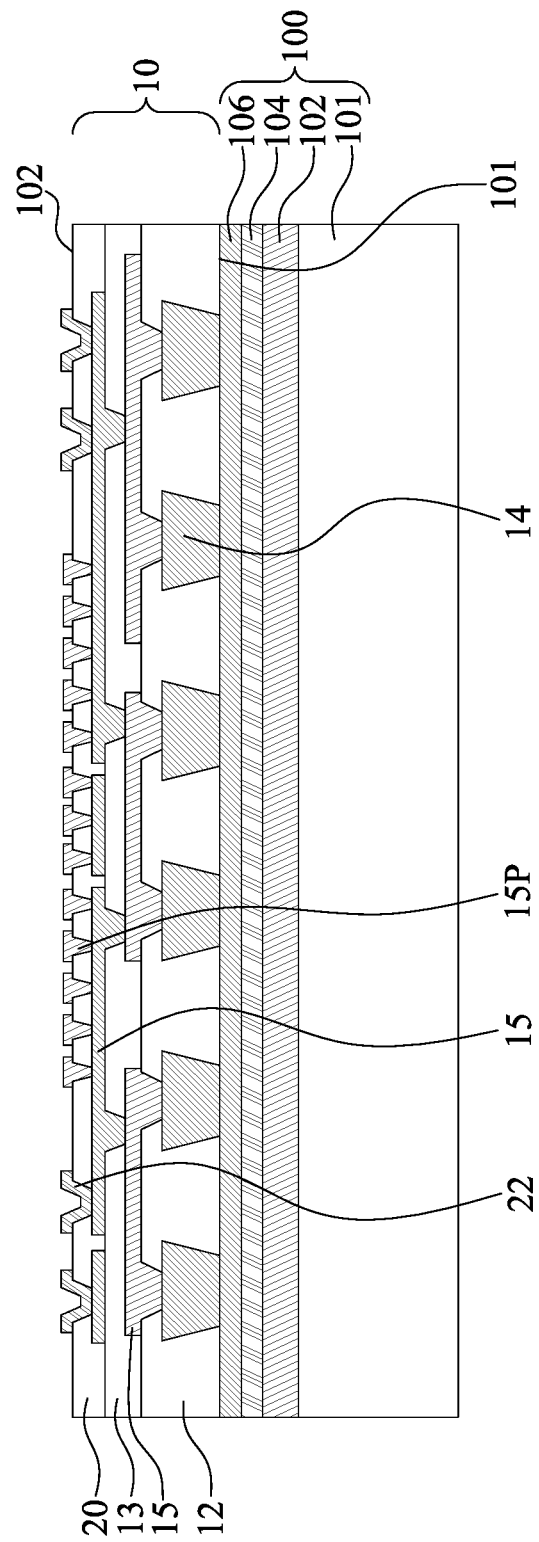

As shown in FIG. 3B, a pad 14 is formed on the conductive layer 106. The pad 14 can be formed by electroplating using the conductive layer 106 as a seed layer. Thus, no additional seed layer is required. In some arrangements, the dimension of the pad 14 increases from the bottom surface proximal to the conductive layer 106 to the upper surface away from the conductive layer 106. A circuit layer (also referred to as a first circuit layer) 10 is then formed on the pad 14 and the conductive layer 106 of the panel-level substrate 100. The circuit layer 10 may be formed by a bumping process. In a bumping process, a plurality of dielectric layers and conductive layers are alternately formed on the panel-level substrate 100, and patterned and defined by e.g., photolithography-plating-etching technique. In some arrangements, the first dielectric layer 12 is formed. The first dielectric layer 12 includes a first opening 12H that has an aperture having a width that is gradually increasing. The aperture surrounds the pad 141. By way of example, the first opening 12H has a first aperture 12H1 proximal to the first surface 101, and a second aperture 12H2 away from the first surface 101 and larger than the first aperture 12H1, as disclosed herein. The inverted trapezoid cross-sectional shape of the first opening 12H is formed due to the profile of the pad 14. A wiring layer 15 is then formed on the first dielectric layer 12, and a portion of the wiring layer 15 filled in the first opening 12H. Subsequently, a plurality of dielectric layers such as an intermediate dielectric layer 13 and a second dielectric layer 20, and wiring layers 15 are then formed to form the circuit layer 10. The second dielectric layer 20 may be an uppermost dielectric layer of the circuit layer 10. In some arrangements, a second opening 20H having an aperture with increased aperture size such as an increased aperture width is formed in the second dielectric layer 20. By way of example, a second opening 20H having a third aperture 20H3 proximal to the second surface 102, and a fourth aperture 20H4 away from the second surface 102 and smaller than the third aperture 20H3 is formed in the second dielectric layer 20. An uppermost wiring layer 15 is then formed on the second dielectric layer 20, and a portion of the uppermost wiring layer 15 filled in the second opening 20H forms a second electrical contact 22. In some arrangements, the panel-level substrate 100 and the circuit layer 10 can be divided by e.g., sawing from a panel-level substrate to form a plurality of stripe substrate, which may be compatible with subsequent process.

Figure 3C:
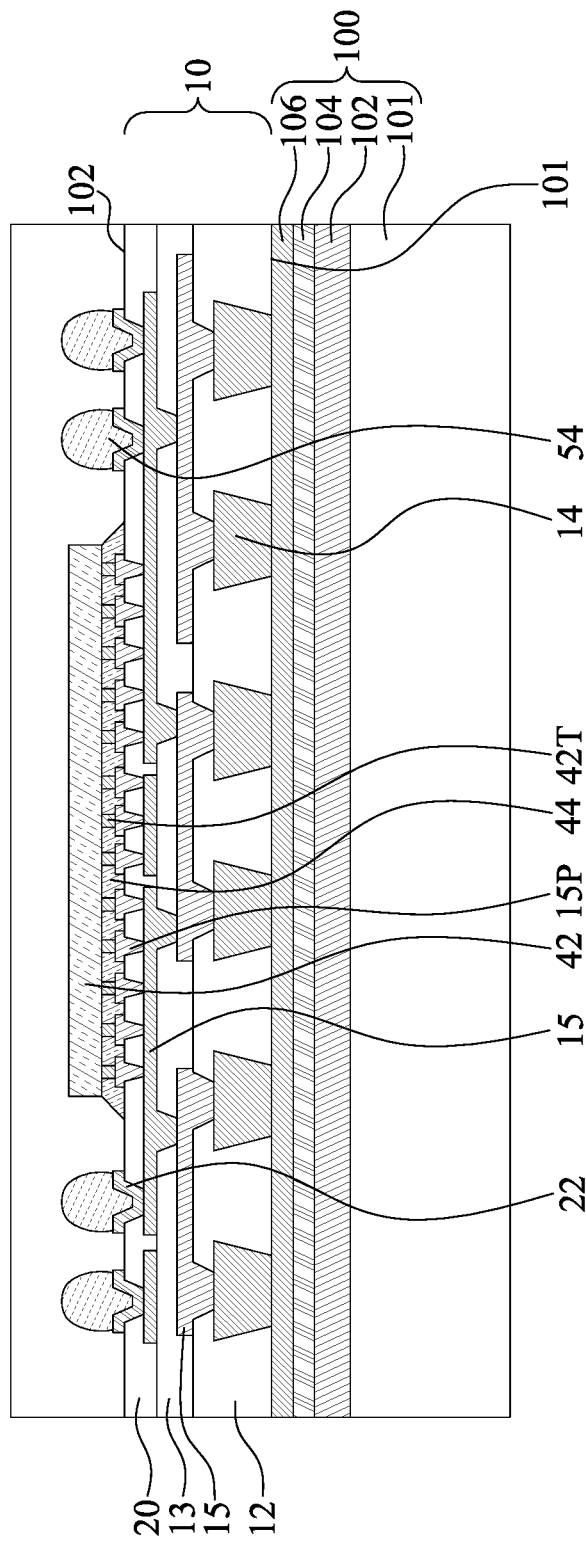
Figure 3D:
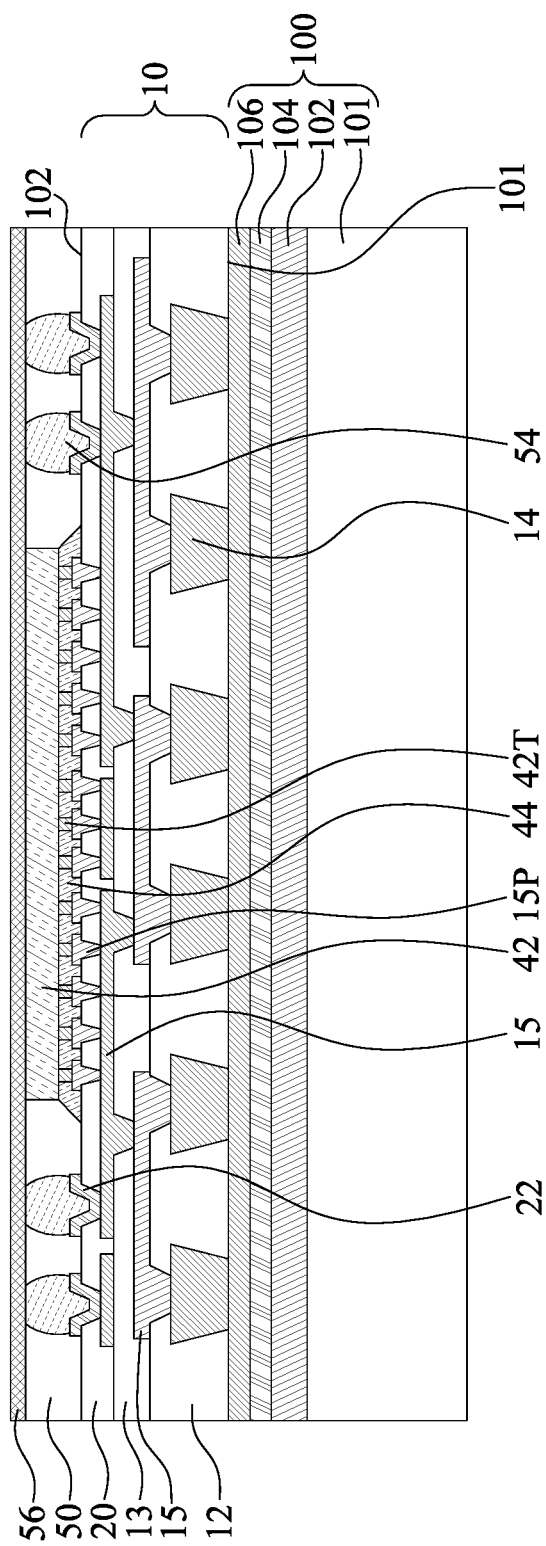
Figure 3E:
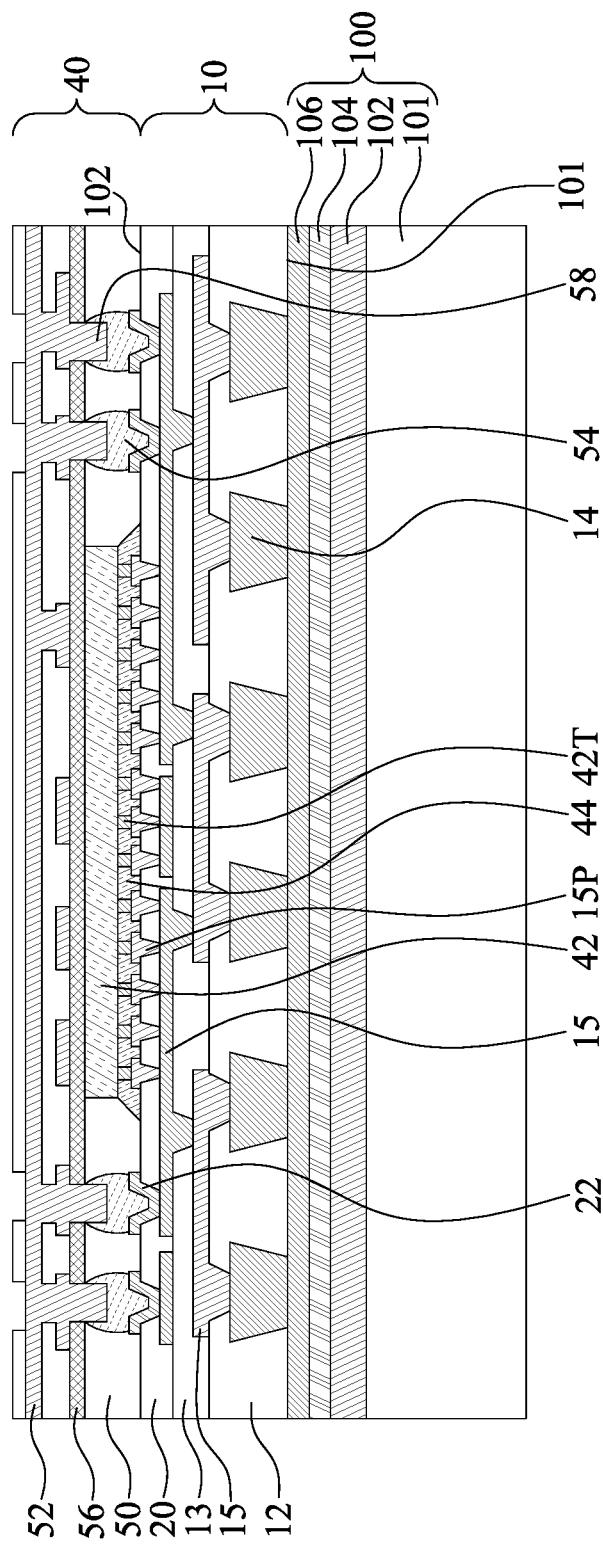

As shown in FIG. 3C-FIG. 3E, an electronic component 40 is formed on the circuit layer 10. In some arrangements, a solder conductor 54 is formed on the second electrical contact 22 and at least one first semiconductor die 42 is mounted on the second surface 102 of the circuit layer 10 and electrically connected to the circuit layer 10 as depicted in FIG. 3C. The solder conductor 54 may be formed by dispensing solder material on the second electrical contact 22, and a reflow process may be performed. Subsequently, a first encapsulation layer 50 is formed on the circuit layer 10 to encapsulate the first semiconductor die 42 and the solder conductor 54. As depicted in FIG. 3D, the first encapsulation layer 50 may be thinned by e.g., grinding to expose the solder conductor 54. Subsequently, an adhesion layer 56 such as a non-conductive film (NCF) or a non-conductive paste (NCP) may be formed on the first encapsulation layer 50. As depicted in FIG. 3E, a circuit layer 52 is provided. The circuit layer 52 may be formed in advance, and then disposed on and electrically connected to the first encapsulation layer 50. In some arrangements, the circuit layer 52 may include a conductive structure 58, and the conductive structure 58 may penetrate through the adhesion layer 56 and insert into the solder conductor 54 to electrically connect the circuit layer 10.

Figure 3F:
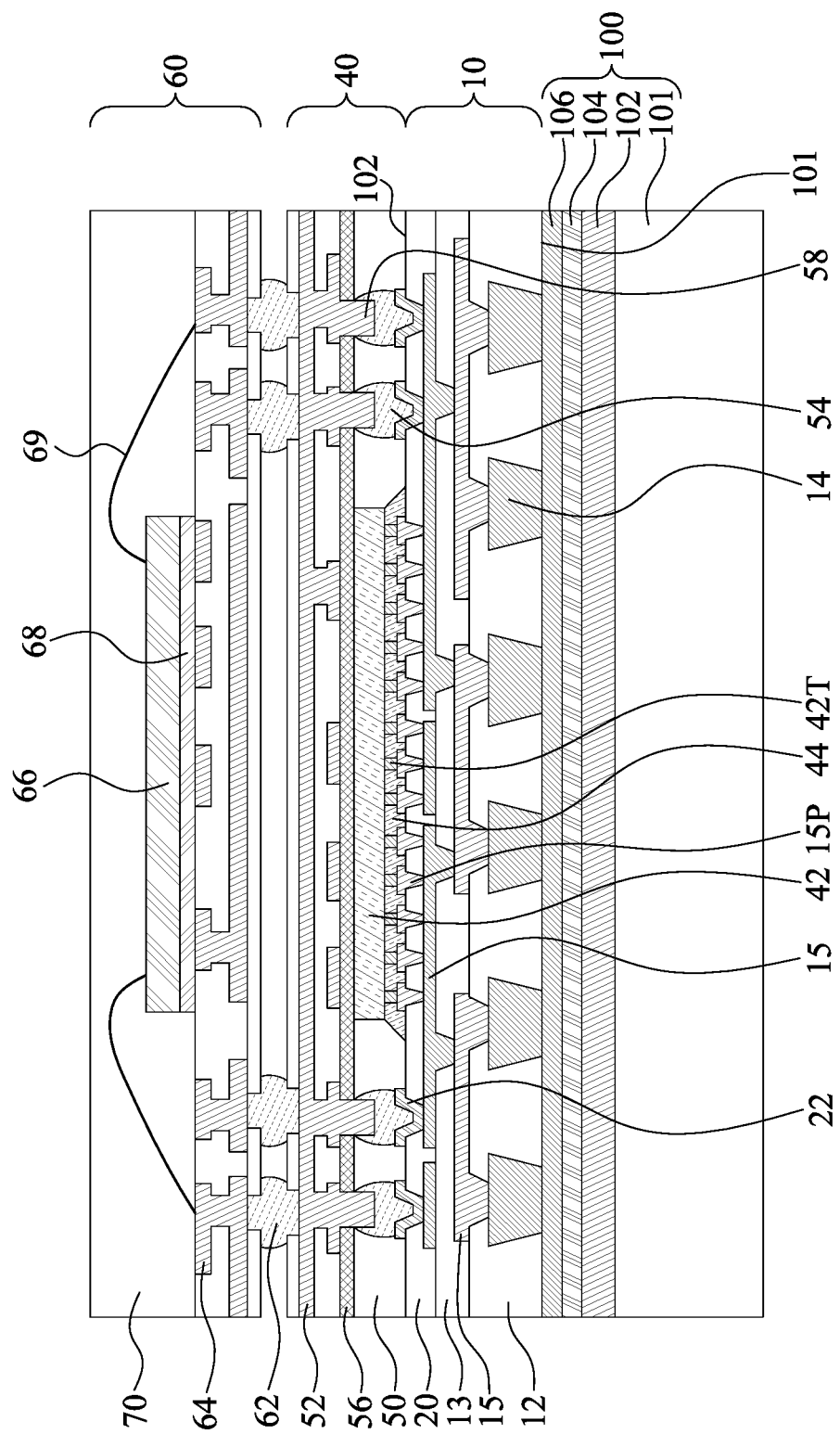

As shown in FIG. 3F, a second electronic component 60 is disposed on the circuit layer 52. In some arrangements, a second semiconductor die 66 is attached to a circuit layer 64 with a die attaching film (DAF) 68, and electrically connected to the circuit layer 64 with bonding wires 69. A second encapsulation layer 70 is then formed on the circuit layer 64 and encapsulates the second semiconductor die 66 to form the second electronic component 60. The second electronic component 60 is then stacked on the electronic component 40 and electrically connected to the electronic component 40 by a third solder conductor 62.

Figure 3G:
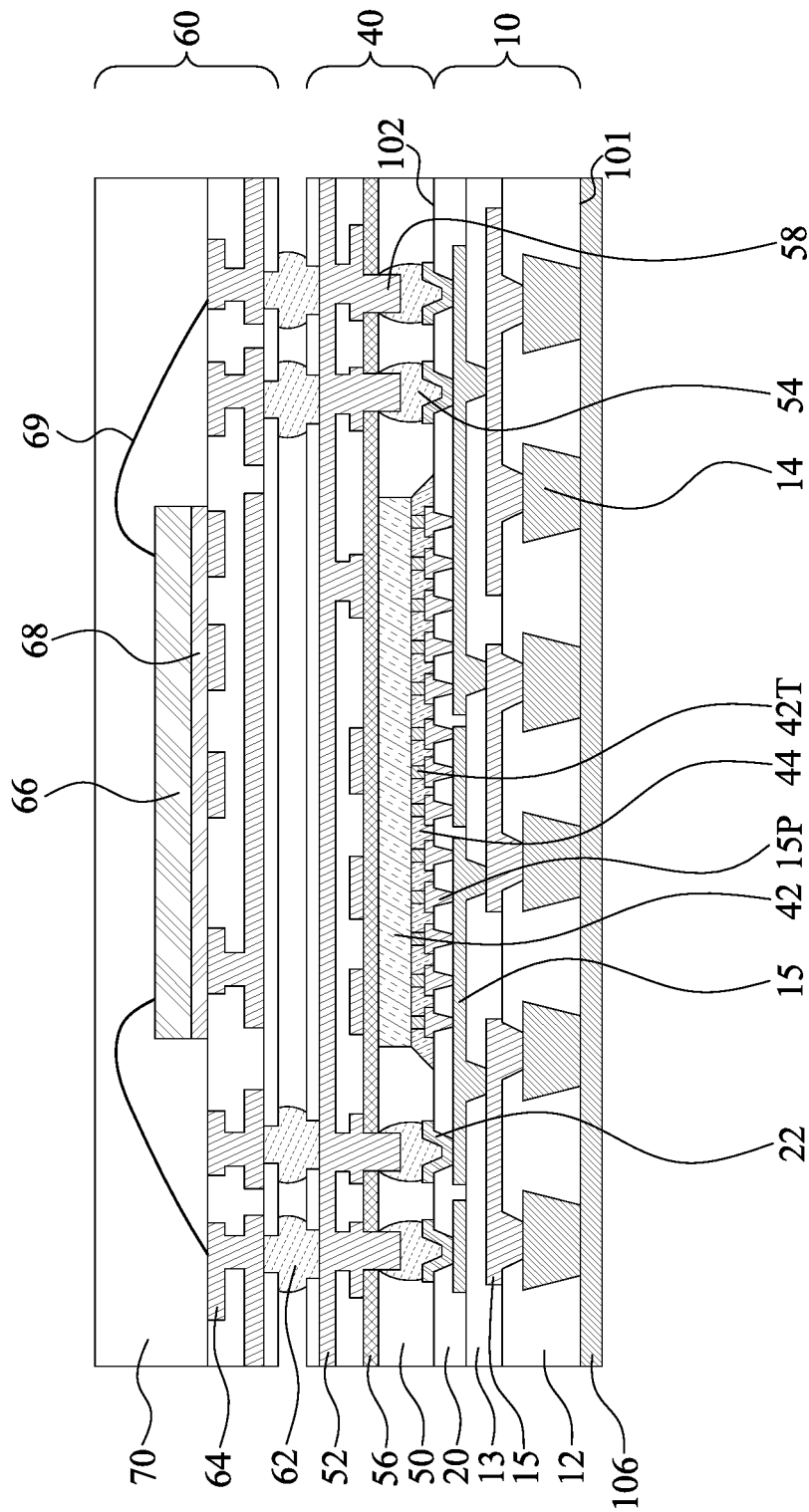

As shown in FIG. 3G, the base material 101, the conductive layer 102 and the releasing film 104 of the panel-level substrate 100 are released from the conductive layer 106, while the conductive layer 106 is preserved on the first surface 101 of the circuit layer 10. The adhesion of the releasing film 104 can be reduced by thermal and/or optical treatment such that the panel-level substrate 100 can be easily released without damaging the circuit layer 10.

Figure 3H:
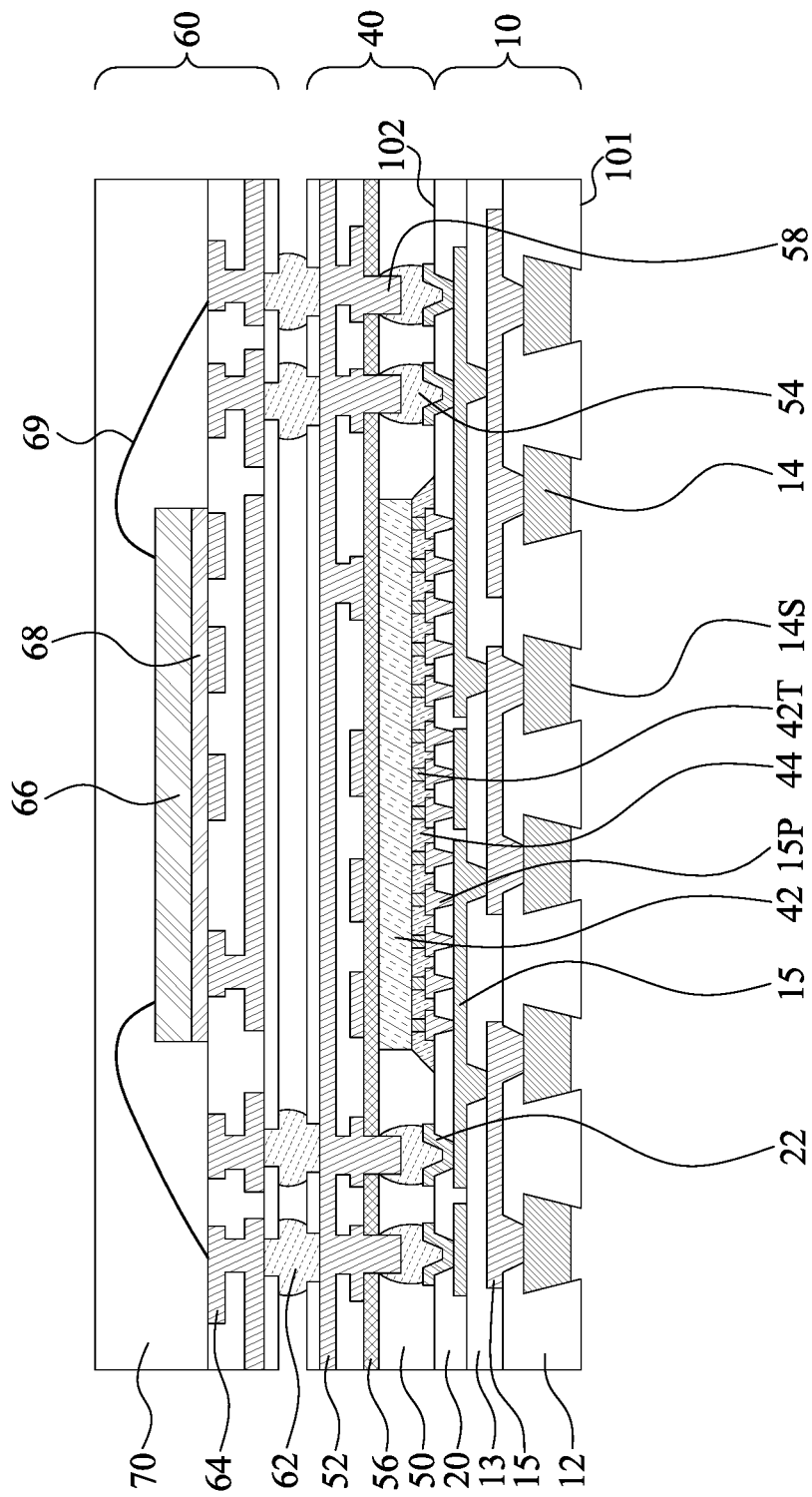
Figure 3I:
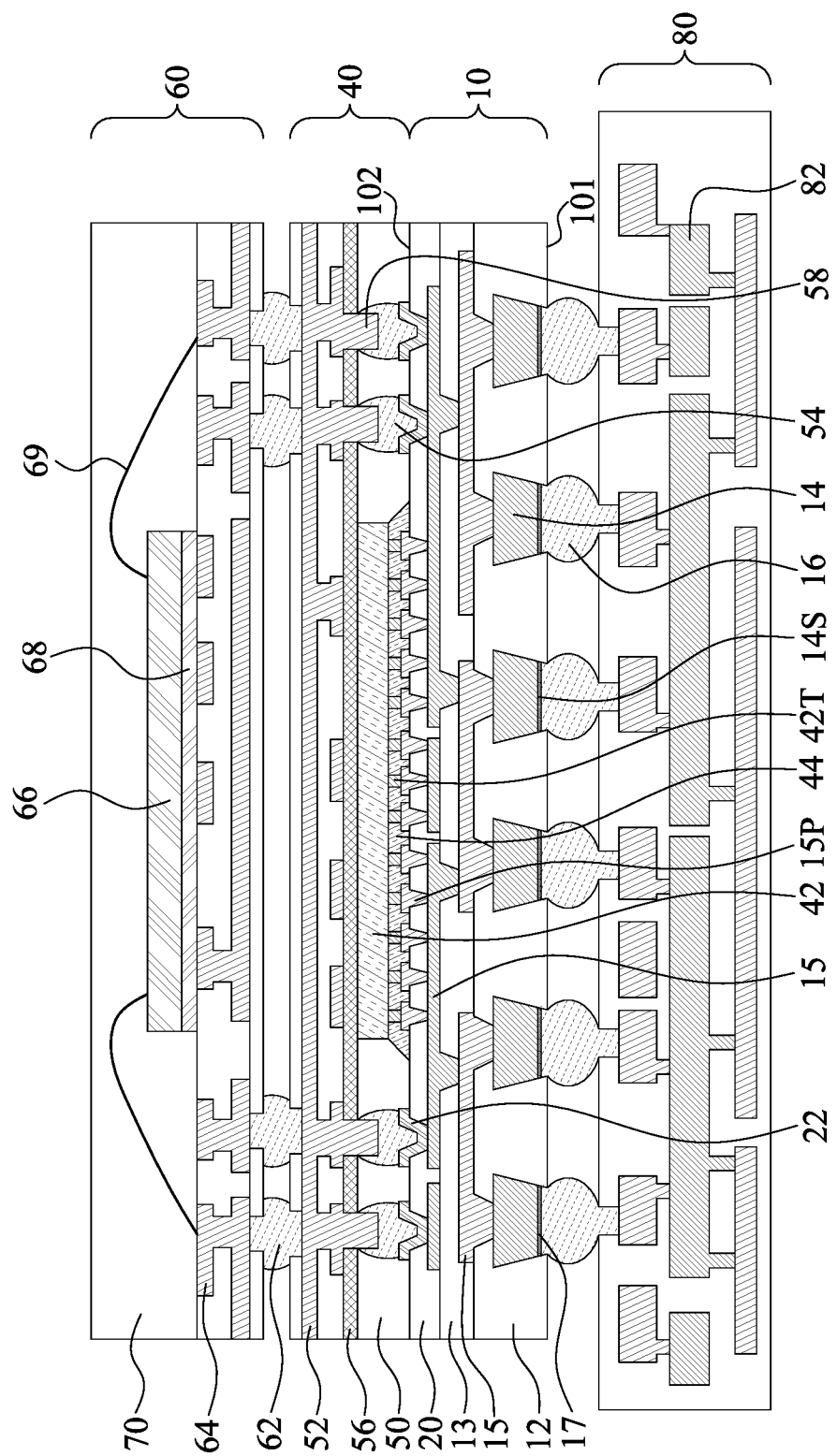

As shown in FIG. 3H, at least a portion of the conductive layer 106 is then removed from the circuit layer 10 to expose the pad 14 such that the electrical contact 14 is formed in the circuit layer 10. In some arrangements, the conductive layer 106 is removed by e.g., etching without using a resist pattern to expose the first electrical contact 14 through the first opening 12H. In some arrangements, the first electrical contact 14 may be partially etched after the conductive layer 106 is removed, and the surface 14S of the first electrical contact 14 may be recessed from the first surface 101 of the circuit layer 10. In some other arrangements, the first electrical contact 14 may be intact when etching the conductive layer 106 such that the surface 14S of the first electrical contact 14 may be substantially coplanar with the first surface 101 of the circuit layer 10. A solder conductor 16 may be formed on the first electrical contact 14 to form the electronic device package 1 as illustrated in FIG. 1. An IMC 17 may be formed between the solder conductor 16 and the first electrical contact 14. In some arrangements, the electronic device package 1 can be further bonded to a circuit board 80 such as a PCB with embedded circuitry 82 as illustrated in FIG. 3I. It is contemplated that the first electrical contact 14 is thick enough without requiring flipping over the circuit layer 10 to form a UBM. Accordingly, the first electrical contact 14 can be bonded to the circuit board 80 without flipping over the circuit layer 10 after the conductive layer 106 is removed from the circuit layer 10, and thus the fabrication process is simplified and the fabrication cost can be reduced.

Figure 4A:
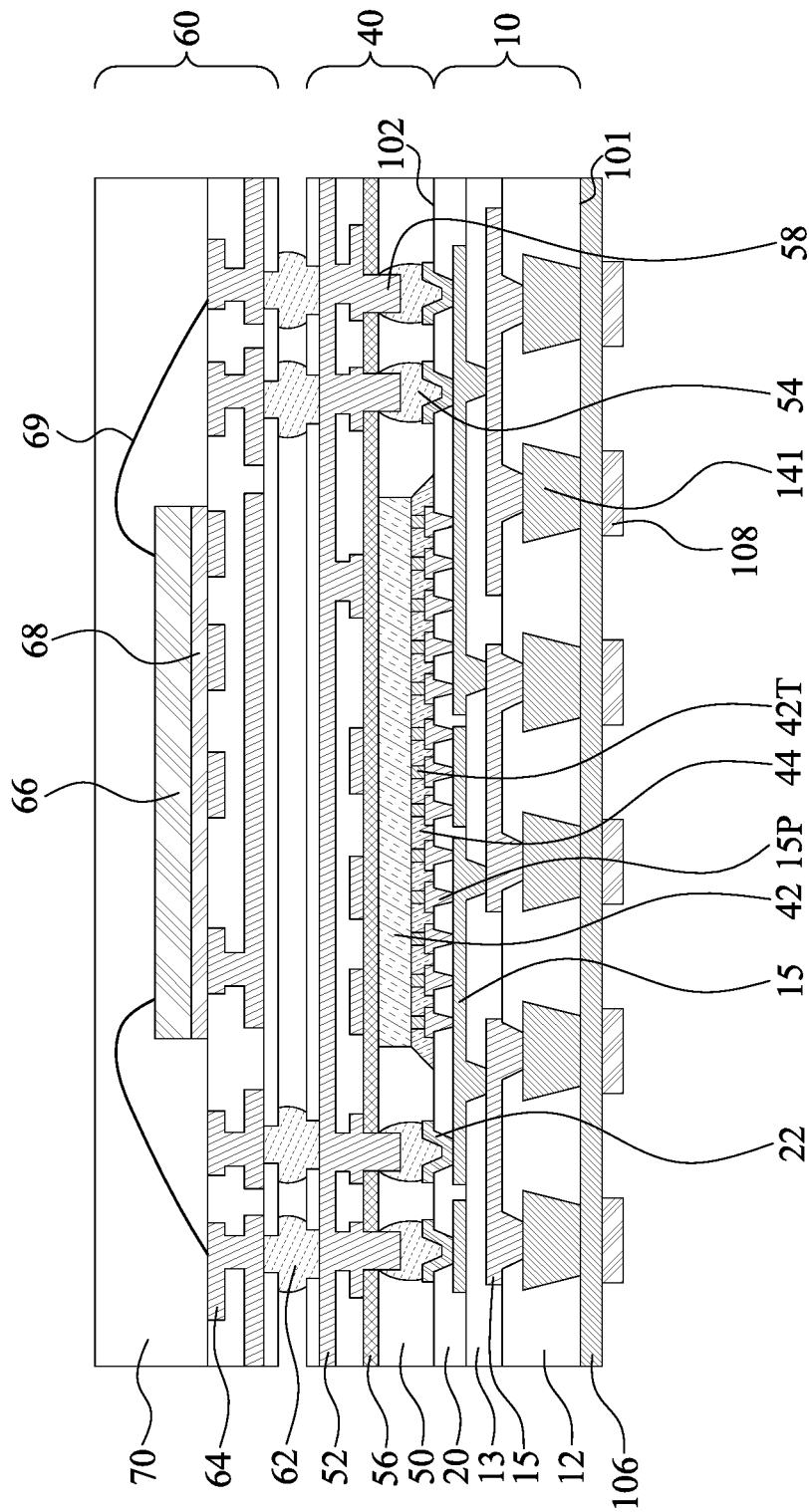
FIG. 4A, FIG. 4B and FIG. 4C illustrate operations of manufacturing an electronic device package in accordance with some arrangements of the present disclosure.
Figure 4B:
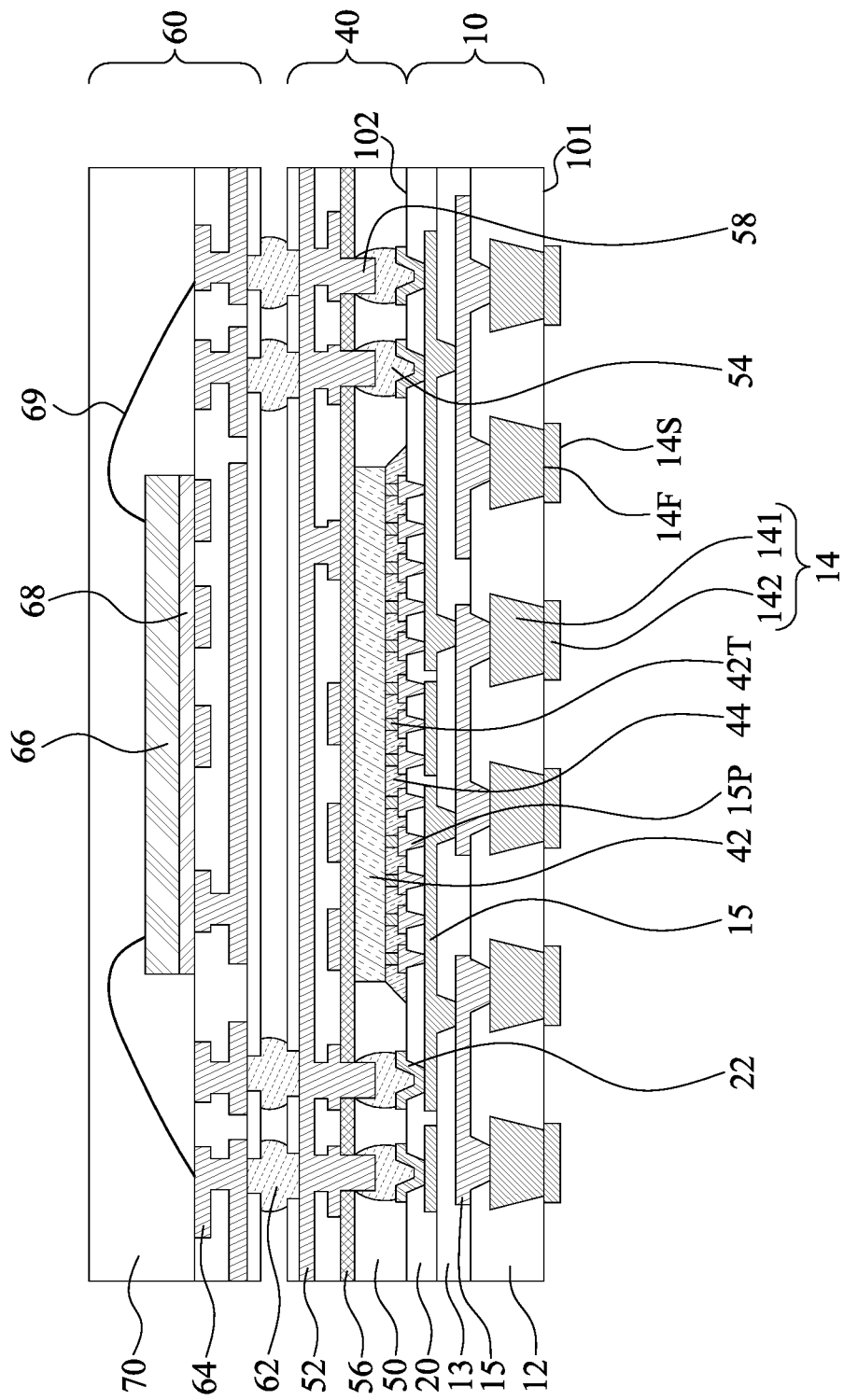
Figure 4C:
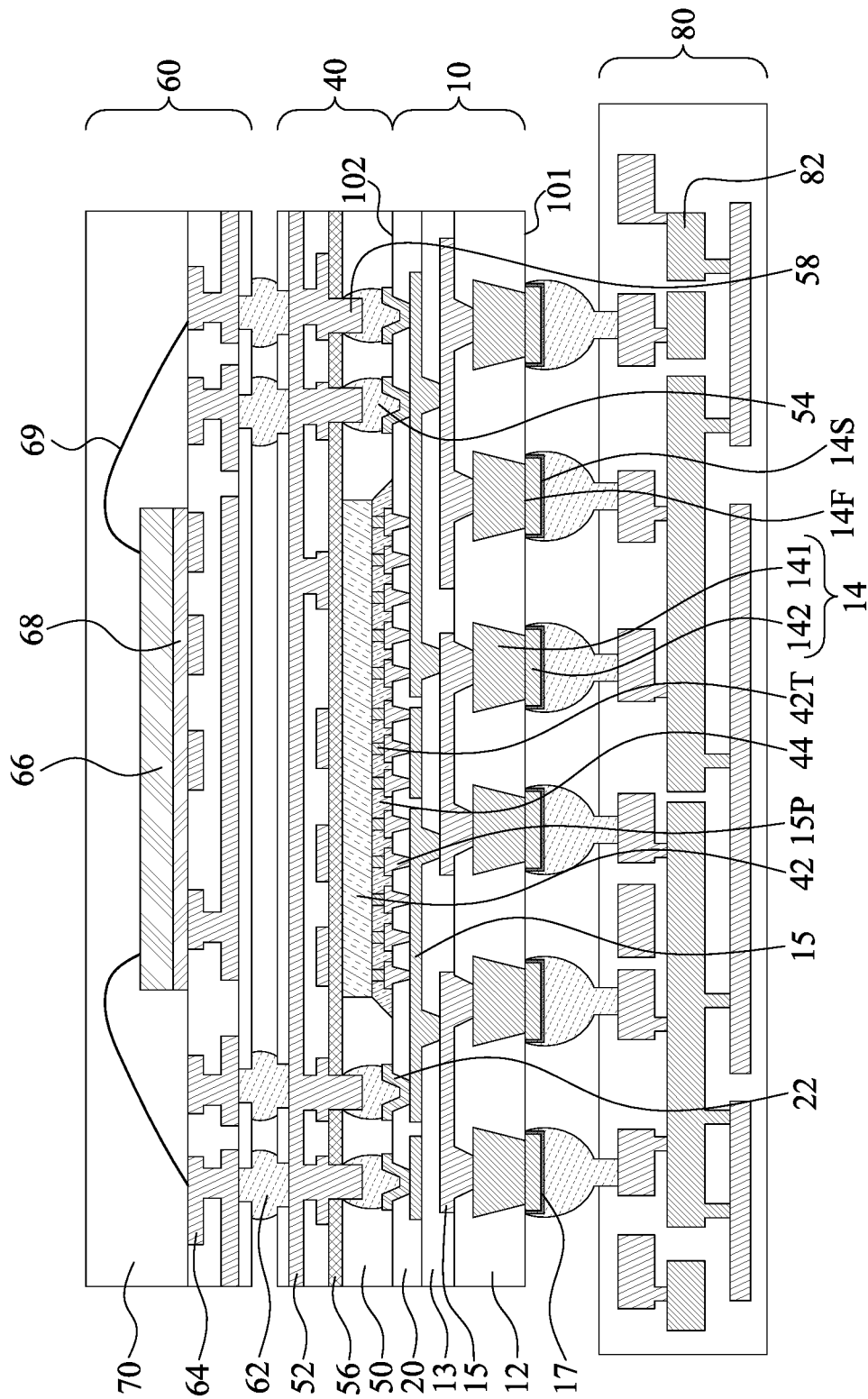

FIG. 4A, FIG. 4B and FIG. 4C illustrate operations of manufacturing an electronic device package in accordance with some arrangements of the present disclosure. It is appreciated that the operations illustrated in FIG. 4A, FIG. 4B and FIG. 4C are performed subsequent to the operations in FIG. 3F. As shown in FIG. 4A, a resist pattern 108 such as a dry film photoresist pattern or other type of photoresist pattern is formed to partially cover the conductive layer 106 after the panel-level substrate 100 is released from the conductive layer 106. The resist pattern 108 may be substantially aligned with the first opening 12H. By way of example, the width of the resist pattern 108 may be slightly larger than the second aperture 12H2. As shown in FIG. 4B, the conductive layer 106 exposed from the resist pattern 108 is etched while the conductive layer 106 covered by the resist pattern 108 is reserved. Accordingly, the wiring layer 105 in the first opening 12H forma a first portion 141 of the first electrical contact 14, and the conductive layer 106 remaining on the first surface 101 of the circuit layer 10 forma a second portion 142 of the first electrical contact 14. In some arrangements, the second portion 142 is wider than the first portion 141, as described herein. Subsequently, the resist pattern 108 is removed. A solder conductor 16 may be formed on the first electrical contact 14 to form the electronic device package 2 as illustrated in FIG. 2B. In some other arrangements, the second portion 142 is narrower than the first portion 141, and the electronic device package as shown in FIG. 2C can be formed after the solder conductor 16 is formed. In some arrangements, the electronic device package 2 can be further bonded to a circuit board 80 with embedded circuitry 82 as illustrated in FIG. 4C. It is contemplated that the first electrical contact 14 is thick enough without requiring flipping over the circuit layer 10 to form a UBM. Accordingly, the first electrical contact 14 can be bonded to the circuit board 80 without flipping over the circuit layer 10 after the conductive layer 106 is removed from the circuit layer 10, and thus the fabrication process is simplified and the fabrication cost can be reduced.

In the description of some arrangements, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific arrangements thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device package, comprising:
   a circuit structure comprising:
      a first dielectric layer;
      a pad embedded in the first dielectric layer and having a first surface exposed by a bottom surface of the first dielectric layer and a second surface opposite to the first surface;
      a first wiring layer disposed over the second surface of the pad; and
      a first conductive via disposed between the first wiring layer and the pad; and
   a first solder contacting the first surface of the pad, wherein a thickness of the pad is greater than a sum of a thickness of the first wiring layer and a thickness of the first conductive via;
   wherein the bottom surface of the first dielectric layer defines an opening exposing the first surface of the pad, the first dielectric layer has an inner sidewall aligned with a lateral surface of the pad, the inner sidewall including a continuous curved surface extending from the second surface of the pad to the bottom surface of the first dielectric layer, and a width of the opening is less than a width of the first surface of the pad.

2. The electronic device package of claim 1, wherein a thickness of the first dielectric layer is greater than the thickness of the pad.

3. The electronic device package of claim 2, wherein the second surface of the pad is exposed by a top surface of the first dielectric layer, the second surface of the pad is recessed with respect to the top surface of the first dielectric layer, and the first surface of the pad is recessed with respect to the bottom surface of the first dielectric layer.

4. The electronic device package of claim 2, wherein the circuit structure further comprises a second dielectric layer over the first dielectric layer and encapsulating the first wiring layer, and the thickness of the first dielectric layer is greater than a thickness of the second dielectric layer.

5. An electronic device package, comprising:
a circuit structure comprising:
a first dielectric layer;
a pad embedded in the first dielectric layer and having a first surface exposed by a bottom surface of the first dielectric layer and a second surface opposite to the first surface;
a first wiring layer disposed over the second surface of the pad; and
a first conductive via disposed between the first wiring layer and the pad; and
a first solder contacting the first surface of the pad, wherein a thickness of the pad is greater than a sum of a thickness of the first wiring layer and a thickness of the first conductive via;
wherein the circuit structure further comprises a second wiring layer over the first wiring layer, and a thickness of the second wiring layer is less than the thickness of the first wiring layer; and
wherein the circuit structure further comprises a second conductive via between the first wiring layer and the second wiring layer, a first interface is formed between the second conductive via and the first wiring layer, a second interface is formed between the first conductive via and the pad, and a width of the first interface is less than a width of the second interface.

6. The electronic device package of claim 5, wherein the thickness of the pad is greater than a sum of a thickness of the second conductive via and the thickness of the second wiring layer.

7. An electronic device package, comprising:
a circuit structure comprising:
a first dielectric layer;
a pad embedded in the first dielectric layer and having a first surface exposed by a bottom surface of the first dielectric layer and a second surface opposite to the first surface;
a first wiring layer disposed over the second surface of the pad; and
a first conductive via disposed between the first wiring layer and the pad;
a first solder contacting the first surface of the pad, wherein a thickness of the pad is greater than a sum of a thickness of the first wiring layer and a thickness of the first conductive via; and
an under bump metallurgy (UBM) above the first wiring layer, wherein a thickness of the UBM is less than the thickness of the pad, and a width of the UBM is less than a width of the pad.

8. The electronic device package of claim 7, further comprising:
a second solder directly contacting the UBM;
a semiconductor die disposed over the circuit structure and horizontally overlapping the second solder; and
a pillar extending into the second solder, wherein the pillar comprises a bottom surface facing the circuit structure and higher than an elevation of an active surface of the semiconductor die with respect to the bottom surface of the first dielectric layer.

9. The electronic device package of claim 8, wherein a size of the second solder is less than a size of the first solder.

10. The electronic device package of claim 8, further comprising a substrate disposed over the second solder, and an intermediate layer between the substrate and the second solder, wherein an elevation of a bottom surface of the intermediate layer is not lower than an elevation of a top end of the second solder with respect to the bottom surface of the first dielectric layer.

* * * * *